United States Patent [19]
Okamoto

[11] Patent Number: 5,930,611
[45] Date of Patent: Jul. 27, 1999

[54] METHOD FOR FABRICATING MIS DEVICE HAVING GATE INSULATOR OF GAS OR GALLIUM SULFIDE

[75] Inventor: Naoya Okamoto, Kawasaki, Japan

[73] Assignee: Fujitsu Limited, Kanagawa, Japan

[21] Appl. No.: 08/923,599

[22] Filed: Sep. 4, 1997

[30] Foreign Application Priority Data

Mar. 5, 1997 [JP] Japan .................................. 9-050167

[51] Int. Cl.⁶ .................................................. H01L 21/336
[52] U.S. Cl. ........................ 438/197; 438/756; 438/757; 257/289; 257/410; 257/631
[58] Field of Search .................................... 438/197, 756, 438/757, FOR 424; 257/289, 410, 631

[56] References Cited

U.S. PATENT DOCUMENTS 4,334,349  6/1982  Aoyama et al. ........................ 29/579
4,546,540  10/1985  Ueyanagi et al. ...................... 29/579
5,316,618  5/1994  Van Lintel ............................ 156/644

FOREIGN PATENT DOCUMENTS

356051164  5/1981  Japan .

*Primary Examiner*—Peter Toby Brown
*Assistant Examiner*—Long Pham
*Attorney, Agent, or Firm*—Armstrong, Westerman, Hattori, McLeland & Naughton

[57] ABSTRACT

A semiconductor device is fabricated by the step of forming a gate insulation film of a GaS film on a compound semiconductor layer; the step of forming an inter-layer insulation film on the gate insulation film; the step of etching the inter-layer insulation film selectively with respect to the gate insulation film by the use of an etchant containing hydrogen fluoride and ammonium fluoride, the step of exposing a prescribed region of the gate insulation film; and the step of forming a gate electrode on the exposed gate insulation film.

5 Claims, 6 Drawing Sheets

METHOD FOR FABRICATING MIS DEVICE HAVING GATE INSULATOR OF GAS OR GALLIUM SULFIDE

BACKGROUND OF THE INVENTION

The present invention relates to a method for fabricating a semiconductor device, more specifically to a semiconductor device comprising a GaS film on a compound semiconductor layer, and a method for fabricating the same.

Recently, semiconductor devices using compound semiconductors, such as GaAs MESFETs (Metal-Semiconductor Field Effect Transistors) and HEMTs (High Electron Mobility Transistors), are noted as very high speed devices. GaAs MESFETS are already used in mobile communication, as of portable telephones, and HEMTs are used in antennas for satellite broadcasting receivers, etc.

On the other hand, a high speed semiconductor device which is applicable to circuits has an electric power consumption which is low and requires high power outputs. As such device, GaAs MISFETS (Metal-Insulator-Semiconductor Field Effect Transistors) are noted.

Figure 6:
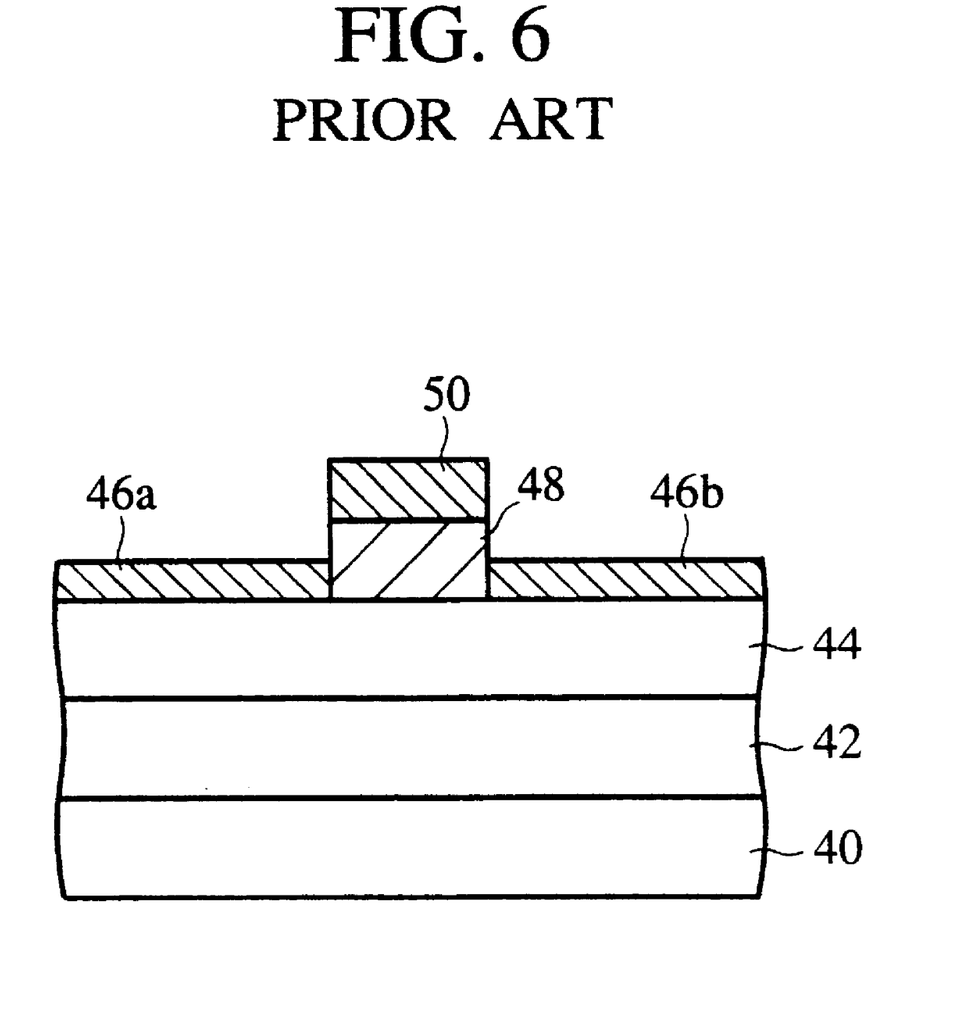
FIG. 6 is a diagrammatic sectional view of a conventional semiconductor device, which shows the structure thereof.

FIG. 6 shows a sectional structural view of a GaAs MISFET, which shows a structure thereof. An undoped GaAs buffer layer 42 is formed on a GaAs substrate 40. A GaAs active layer 44 doped with an n-type impurity is formed on the buffer layer 42. Source electrodes 46a and drain electrodes 46b are formed on the active layer 44, spaced from each other. Gate electrodes 50 are formed on the active layer 44 between the respective source electrodes 46a and the drain electrodes 46b through a gate insulation film 48.

The MISFET uses field effect of electric fields applied to the active layer 44, and it is very important for the device to have better device characteristics how to suppress affection of interface states between the active layer 44 and the gate insulation film 48.

Conventionally as the gate insulation film 48 of the GaAs MISFET, insulation films of $SiO_2$, $Al_2O_3$ etc. have been studied. However, it is known that the formation of the gate insulation film 48 of such insulation films on the active layer 44 generates high interface state density. It has been found difficult to practically form the GaAs MISFET including the gate insulation film 48 of such insulation films.

In this background, the inventors of the present application proposed a semiconductor device including an amorphous GaS (gallium sulfide) film as the gate insulation film 48 in Japanese Patent Application No. 248170/1996. Because the GaS film can lower the interface state density generated on the interface with the GaAs layer, the use of the GaS film as the gate insulation film 48 allows the GaAs MISFET to have better characteristics.

On the other hand, in consideration of fabricating an integrated circuit of the MISFETs, to interconnect the devices by a metallization layer to be formed on the devices it is essential that the metallization layer is insulated from the regions other than the contact regions. To this end, the tops of the MISFETs must be covered with an inter-layer insulation film of $SiO_2$, SiON, SiN or others.

Furthermore, to connect the metallization layer to the gate electrodes, etc. it is necessary to form openings in the inter-layer insulation film. In addition, the interlayer insulation film must be etched with good selectivity with respect to the gate insulation film of GaS film. This is because erosion of the GaS film due to poor controllability for etching the inter-layer insulation film may degrade characteristics of the MISFETs.

However, the conventional methods for fabricating semiconductor devices have failed to establish a technique of etching the insulation film with good selectivity with respect to the GaS film. In a case that the inter-layer insulation film is formed of $SiO_2$, SiON, SiN or others, the etching cannot be stopped on the gate insulation film with good controllability. Resultantly, characteristics of the MISFETs are often degraded in the step of forming the openings, which makes it impossible to fabricate the integrated circuit of the MISFETS.

SUMMARY OF THE INVENTION

An object of the present invention is to provide a method for fabricating a semiconductor device which allows an insulation film formed on a GaS film to be etched with good selectivity with respect to the GaS film. Another object of the present invention is to provide a structure which can be formed by the method for fabricating a semiconductor device.

The above-described objects are achieved by a method for fabricating a semiconductor device comprising etching a $SiO_2$ film, a SiON film or a SiN film formed on a GaS film selectively with respect to the GaS film by use of an etchant containing hydrogen fluoride and ammonium fluoride. The insulation film is etched with an etchant containing hydrogen fluoride and ammonium fluoride, whereby the insulation film can be etched with good selectivity with respect to the GaS film. In a case that openings are formed in the insulation film on a semiconductor device including a GaS film, characteristics of the semiconductor device are not degraded.

In the above-described method for fabricating a semiconductor device, it is preferable that the etchant contains ammonium fluoride by an above 8 mixing ratio in terms of mass versus a 1 mixing ratio of hydrogen fluoride. A mixing ratio of the etchant is set as above, whereby good selectivity with respect to the GaS film can be obtained.

The above-described objects can be achieved by a method for fabricating a semiconductor device comprising the steps of: forming a gate insulation film of a GaS film on a compound semiconductor layer; forming an inter-layer insulation film of a $SiO_2$ film, SiON film or SiN film on the gate insulation film; etching the inter-layer insulation film selectively with respect to the gate insulation film to expose a prescribed region of the gate insulation film; and forming a gate electrode on the exposed gate insulation film. The openings can be formed in the inter-layer insulation film without degrading characteristics of a MISFET including a gate insulation film of GaS film. This permits the metallization layer which is to be connected to the gate electrode to be formed on MISFETs, which facilitates integration of GsAs MISFETs.

In the above-described method for fabricating a semiconductor device, it is preferable that the inter-layer insulation film is etched by an etchant containing hydrogen fluoride and ammonium fluoride. The use of the etchant containing hydrogen fluoride and ammonium fluoride allows the openings to be formed in the inter-layer insulation film without eroding the GaS film.

The above-described objects can be achieved by a semiconductor device comprising: a compound semiconductor layer; a gate insulation film of a GaS film formed on the compound semiconductor layer; an inter-layer insulation film formed on the gate insulation film; source/drain electrodes formed on the compound semiconductor layer in openings opened through the inter-layer insulation film and the gate insulation film; and a gate electrode formed on the gate insulation film in an opening formed through the inter-layer insulation film. This semiconductor device structure facilitates integration of GaAs MISFETs.

In the above-described semiconductor device, it is preferable that the device further comprises a metallization layer, a resistor, an inductor and/or a capacitor formed on the inter-layer insulation film and connected to the gate electrode and/or the source/drain electrodes in the openings.

DETAILED DESCRIPTION OF THE INVENTION

First, the principle of the present invention will be explained with reference to FIG. 1.

Figure 1:
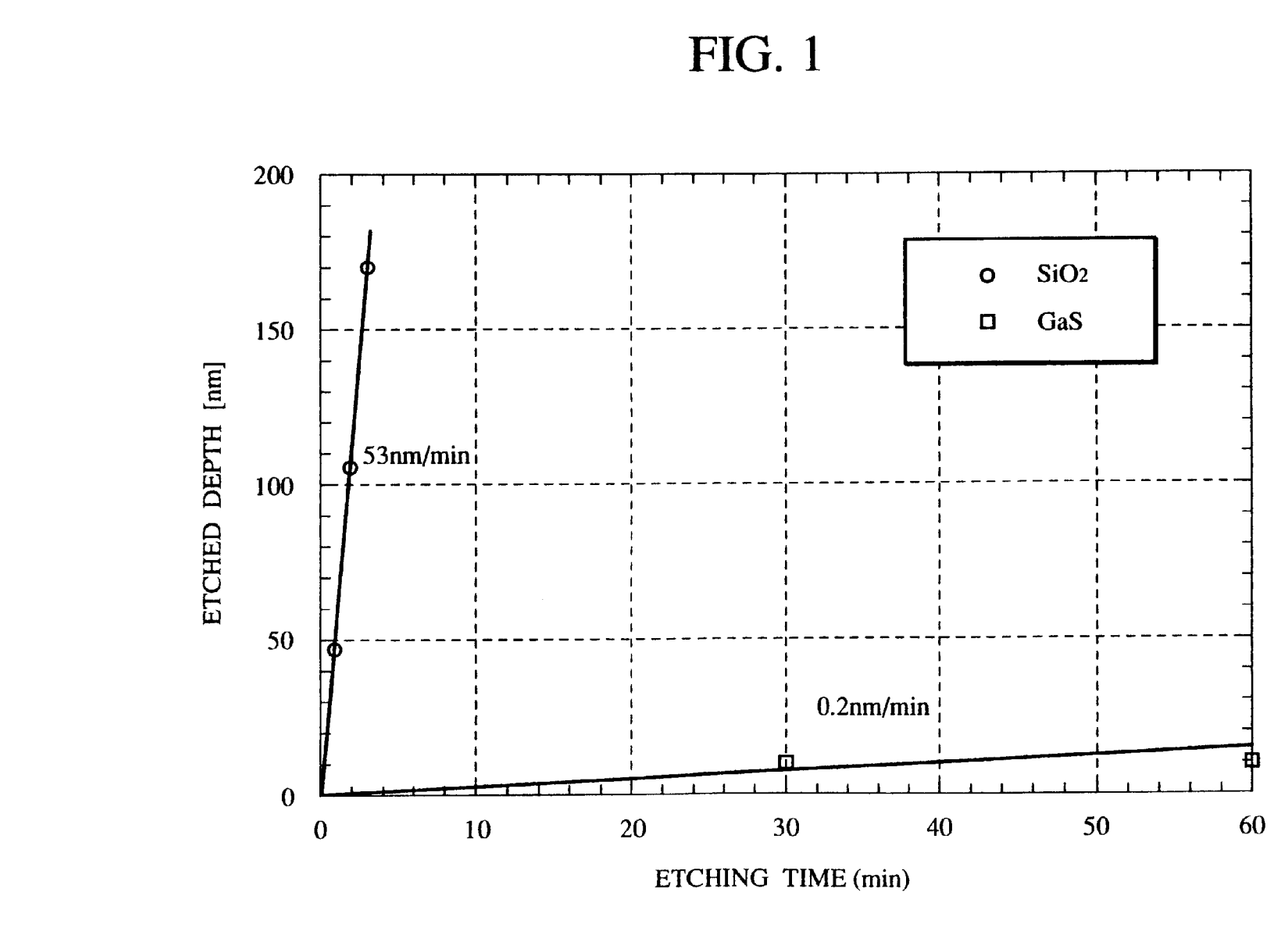
FIG. 1 is a graph of relationships between etching rates of $SiO_2$ film and GaS film and etching periods of time in the method for fabricating a semiconductor device according to the present invention.

FIG. 1 is a graph of etching rates of $SiO_2$ film and GaS film according to the method for fabricating a semiconductor device of the present invention.

The present invention is characterized in that $SiO_2$ film, SiON film and SiN film are etched by the use of an etchant including an aqueous solution of hydrogen fluoride (HF) and an aqueous solution of ammonium fluoride ($NH_4F$). The insulation film is etched by this etchant, whereby the insulation film can be removed without damaging the GaS film below the insulation film.

The result of the measured etching selectivity the present invention is based on will be explained.

As an etchant, a mixed liquid containing an aqueous solution of hydrogen fluoride (mass ratio: 50%) and an aqueous solution of ammonium fluoride (mass ratio: 40%) by a 1:40 volume ratio was prepared.

Then, a sample including a 380 nm-thick GaS film deposited on a GaAs substrate, and a sample including a 1 $\mu$m-thick $SiO_2$ film deposited on a GaAs substrate were prepared. These samples were immersed in the etchant for prescribed periods of time to etch the $SiO_2$ film and the GaS film on the surfaces. A temperature of the etchant was the room temperature.

Then, etched depths of the $SiO_2$ film and the GaS film were measured by a stylus profiler and relationships between the etching depths and the etching periods of time were investigated.

The relationships between the measured etching depths and the etching periods of time are shown in FIG. 1. As shown, an etching rate of $SiO_2$ film is about 53 nm/min (indicated by the circles in FIG. 1), and that of the GaS film (indicated by the squares) was about 0.2 nm/min. Based on this result, it is found that by using the etchant formed of the aqueous solution of hydrogen fluoride and the aqueous solution of ammonium fluoride, the $SiO_2$ film can be removed by an about 265 selective ratio with respect to the GaS film.

The same measurement was conducted by the use of a mixed liquid containing an aqueous solution of hydrogen fluoride and an aqueous solution of ammonium fluoride by a 1:20 volume ratio. In comparison with the case using the mixed liquid of a 1:40 volume ratio, the etching rate of the GaS film was higher, but the GaS film was remained even after 60 minutes of the immersion. However, as a result of the same measurement using a mixed liquid containing an aqueous solution of hydrogen fluoride and an aqueous solution of ammonium fluoride by a 1:10 volume ratio, peeling and erosion were observed on the GaS film which was water-rinsed after 60 minutes of the immersion. To ensure selectivity of the etching it is preferable that an aqueous solution of ammonium fluoride is added by an at least 10 volume ratio or higher to a 1 volume ratio of an aqueous solution of hydrogen fluoride.

This mixing ratio is for an etchant containing an aqueous solution of hydrogen fluoride by a 50% mass ratio and an aqueous solution of ammonium fluoride by a 40% mass ratio. Accordingly, in terms of a mixing ratio between hydrogen fluoride and ammonium fluoride in the etchant it is preferable that, with a mixing ratio of hydrogen fluoride being 1, a mixing ratio of ammonium fluoride is higher than 8 in a mass ratio.

The etchant containing an aqueous solution of hydrogen fluoride and an aqueous solution of ammonium fluoride by a 1:10 volume ratio has a mass ratio of about 1:8:13 among the hydrogen fluoride, ammonium fluoride and $H_2O$. However, etching rates of the $SiO_2$ film and the GaS film are lowered as a ratio of $H_2O$ contained in the etchant is higher. An etching selective ratio of the $SiO_2$ film with respect to the GaS film is lowered as a ratio of the $H_2O$ is higher. Accordingly, it is preferable to set a mixing ratio between hydrogen fluoride and ammonium fluoride in consideration of a ratio of $H_2O$ in the etchant.

In the etchant which is a mixed liquid of an aqueous solution of hydrogen fluoride and an aqueous solution of ammonium fluoride, the ammonium fluoride functions as buffer agent, and as a mixing ratio of the ammonium fluoride is higher, an etching rate of the GaS film is decreased, and a selective ratio thereof with respect to the $SiO_2$ film is increased. On the other hand, an etching rate of the $SiO_2$ film is also decreased as a mixing ratio of the ammonium fluoride is increased although a decrease ratio is small in comparison with a decrease ratio of an etching rate of the GaS film.

Thus, it is preferable that a mixing ratio between an aqueous solution of hydrogen fluoride and an aqueous solution of ammonium fluoride is set suitably in accordance with a film thickness of the $SiO_2$ film to be etched, and a required selective ratio.

An etchant formed of a mixed liquid of an aqueous solution of hydrogen fluoride and an aqueous solution of ammonium fluoride is able to etch SiON film and SiN film. Accordingly, a mixing ratio is so set that a required selective ratio is obtained for the GaS film, whereby the present invention is applicable to a case in which a film to be etched is SiON film or SiN film.

Then, the semiconductor device according to a first embodiment of the present invention and the method for fabricating the same will be explained with reference to FIGS. 2, 3A–3C, 4A–4C and 5A–5C.

Figure 2:
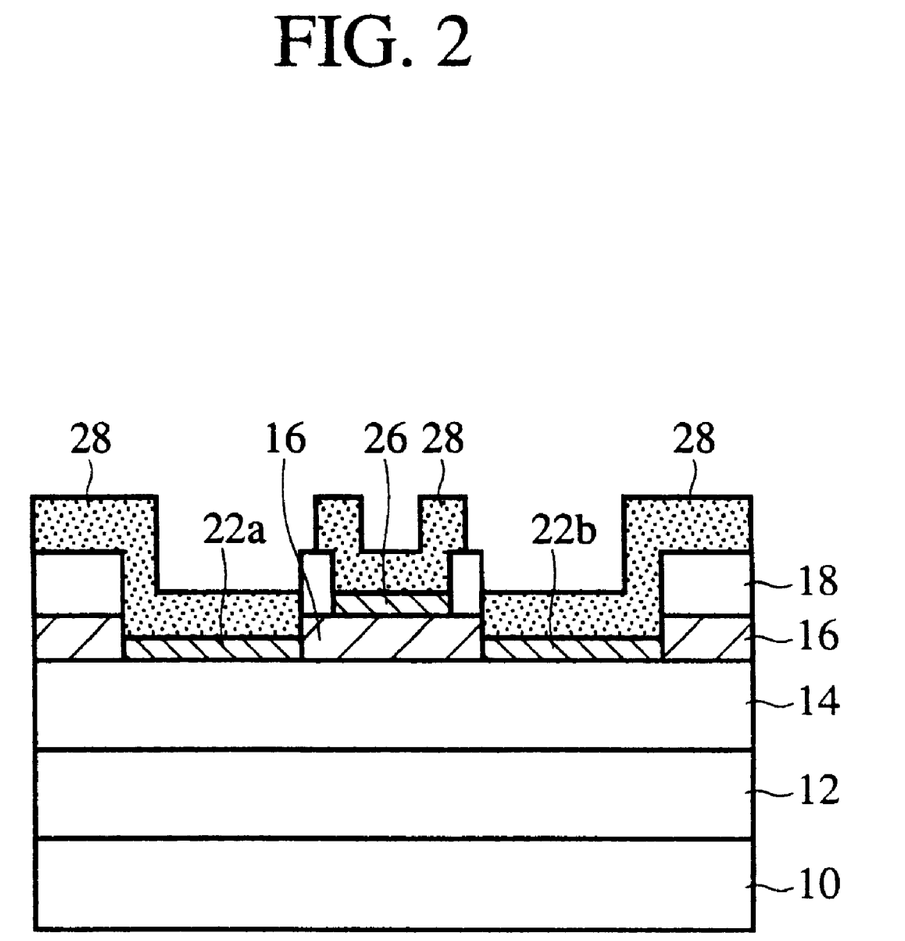
FIG. 2 is a diagrammatic sectional view of the semiconductor device according to one embodiment of the present invention, which shows a structure thereof.

FIG. 2 is a diagrammatical sectional view of the semiconductor device according to the present embodiment, which shows the method for fabricating the semiconductor device. FIGS. 3A–3C, 4A–4C and 5A–5C are sectional views of the semiconductor device according to the present embodiment in the steps of the method for fabricating the same, which explain the method.

First, a structure of the semiconductor device according to the present embodiment will be explained.

A buffer layer 12 of undoped GaAs is formed on a GaAs substrate 10. An n-GaAs active layer 14 is formed on the buffer layer 12. Source/drain electrodes 22a, 22b are formed on the active layer 14, spaced from each other. A gate electrode 26 is formed on the active layer 14 between the source/drain electrodes 22a, 22b through a gate insulation film 16 of GaS film. Thus, a MISFET including the active layer 14 as the channel is formed on the GaAs substrate 10.

An inter-layer insulation film 18 of $SiO_2$ is formed on the MISFET. Openings which are opened on the source/drain electrodes 22a, 22b and on the gate electrode 26 is formed in the inter-layer insulation film 18. Through these openings, a metallization layer 28 is connected to the source/drain electrodes 22a, 22b and to the gate electrode 26.

The gate electrode 26 is formed on the gate insulation film 16 exposed in the opening formed in the inter-layer insulation film 18, and this structure can be easily realized by the method for fabricating the semiconductor device according to the present invention.

Next, the method for fabricating the semiconductor device according to the present embodiment will be explained.

Figure 3A:
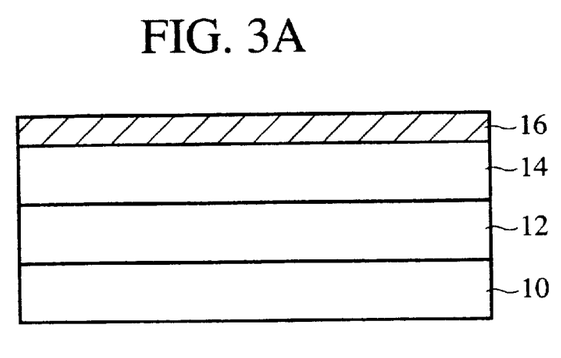
FIGS. 3A–3C are sectional views of the semiconductor device according to the embodiment of the present invention in the step of the method for fabricating the same, which explain the method (Part 1).

First, the undoped GaAs buffer layer 12 and the n-GaAs (donor concentration: $1 \times 10^{17}$ $cm^{-3}$) active layer 14 are epitaxially grown respectively in an about 150 nm-thick and an about 150 nm-thick on the GaAs substrate 10 by, e.g., MBE (Molecular Beam Epitaxy).

Then, the gate insulation film 16 of an about 30 nm thick amorphous GaS film is formed on the active layer 14 (FIG. 3A). The amorphous GaS film is deposited by, e.g., MBE method using tertiary-butyl-gallium-sulfide cubane (((t-Bu) $GaS)_4$) as a source material at a 420° C. substrate temperature. The method for forming the amorphous GaS film is detailed in the specification of Japanese Patent Application No. 248170/1996 filed by the inventors of the present application.

Figure 3B:
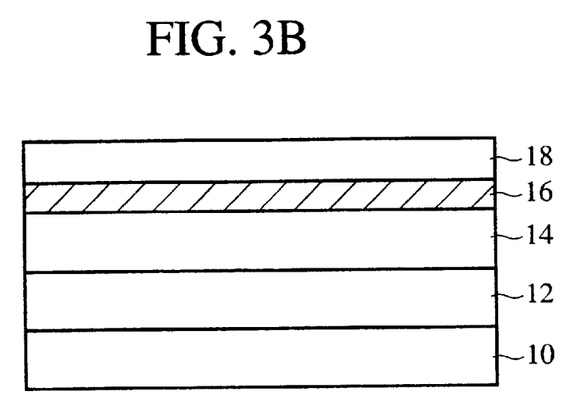

Subsequently, the inter-layer insulation film 18 of an about 100 nm-thick $SiO_2$ film is deposited on the gate insulation film 16 of GaS film (FIG. 3B). The inter-layer insulation film 18 is deposited by, e.g., thermal CVD. The inter-layer insulation film 18 may be deposited by a film forming technique other than thermal CVD, and may be formed of SiON film or SiN film.

Then, a resist pattern 20 for covering the region other than a region for the source/drain electrodes to be formed in is formed by the usual photolithography techniques.

Figure 3C:
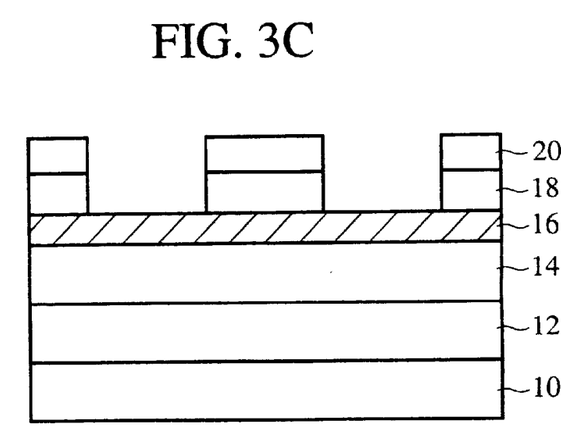

Then, the inter-layer insulation film 18 is selectively etched with the resist pattern 20 as a mask. It is preferable to use the above-described etchant for this etching, which allows a sufficient selective ratio with respect to the base gate insulation film 16 of GaS film. An about 3 minute-immersion in an etchant containing an aqueous solution of hydrogen fluoride and an aqueous solution of ammonium fluoride by a 1:40 mixing ratio enables the inter-layer insulation film 18 to be selectively removed with erosion of the gate insulation film 16 suppressed (FIG. 3C).

Figure 4A:
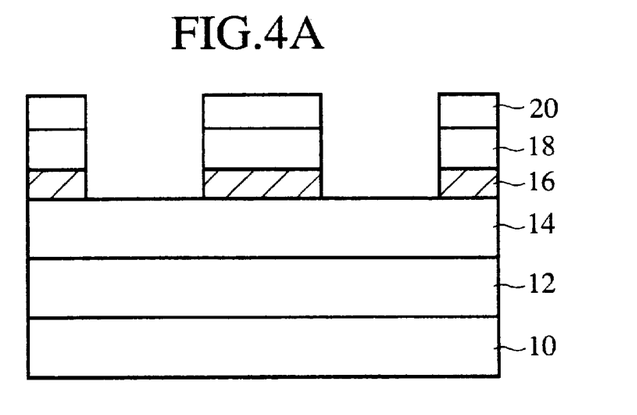
FIGS. 4A–4C are sectional views of the semiconductor device according to the embodiment of the present invention in the step of the method for fabricating the same, which explain the method (Part 2).

Subsequently, the gate insulation film 16 is selectively etched with the resist pattern 20 and the inter-layer insulation film 18 as a mask. The etchant is, e.g., hydrochloric acid. The immersion in the etchant for some minutes enables the gate insulation film 16 of GaS film to be removed without damaging the active layer 14 (FIG. 4A).

Figure 4B:
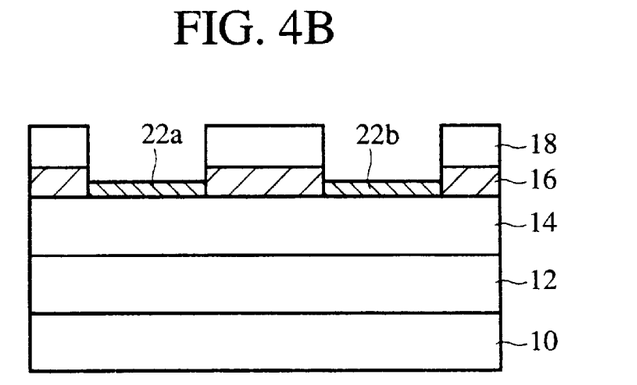

Then, an Ni film and an AuGe film are sequentially deposited by vacuum evaporation method.

Then, the Ni film and the AuGe film are left only on the active layer 14 by lift-off method to form the source/drain electrodes 22a, 22b of the AuGe/Ni structure (FIG. 4B).

Then, a thermal treatment at, e.g., 400° C. for 1 minute is conducted to form eutectic layer between the source/drain electrodes 22a, 22b and the active layer 14 to bring both into ohmic contact with each other.

Figure 4C:
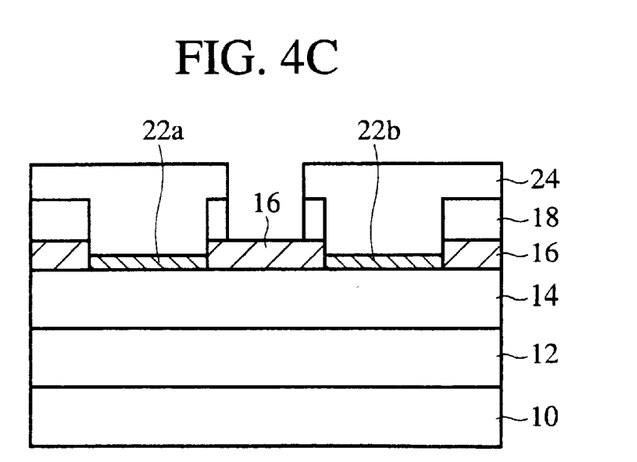

Subsequently, a resist pattern 24 for covering the region other than a region for the gate electrode to be formed in is formed by the usual photolithography techniques.

Then, the inter-layer insulation film 18 is selectively etched with the resist pattern 24 as a mask. The etching uses the above-described etchant which allows a sufficient selective ratio to be obtained with respect to the base gate insulation film 16 of GaS film. The interlayer insulation film 18 can be selectively removed with erosion of the gate insulation film 16 suppressed by about 3 minute-immersion in the etchant containing an aqueous solution of hydrogen fluoride and an aqueous solution of ammonium fluoride by a 1:40 mixing ratio (FIG. 4C).

In this etching step, the gate insulation film 16 directly below the gate electrode 26 is exposed, and it is especially important to remove the inter-layer insulation film 18 with good etching selectivity. This is because erosion of the gate insulation film 16 in etching the inter-layer insulation film 18 much affect characteristics of the MISFET.

The etching technique of the present invention facilitates etching the inter-layer insulation film 18 with erosion of the gate insulation film 16 of GaS film suppressed, whereby characteristics of the MISFET are not degraded in the step of etching the inter-layer insulation film 18.

Figure 5A:
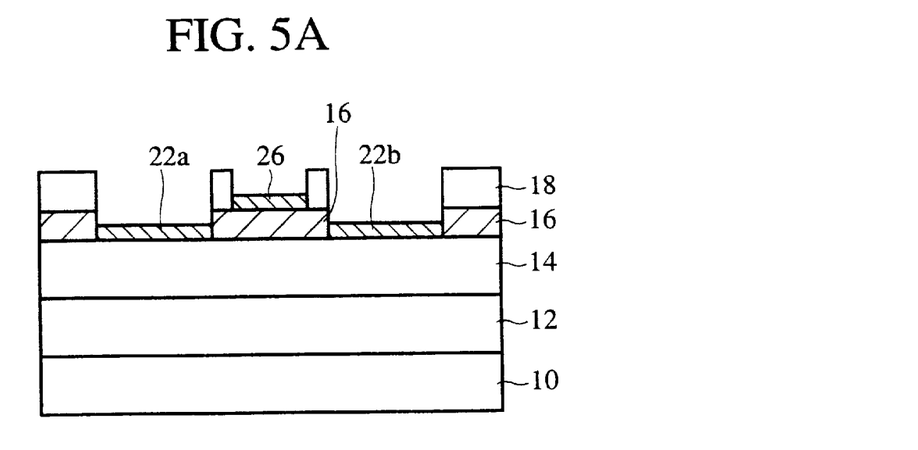
FIGS. 5A–5C are sectional views of the semiconductor device according to the embodiment of the present invention in the step of the method for fabricating the same, which explain the method (Part 3).

Next, a Ti film and an Au film are sequentially deposited by vacuum evaporation method.

Subsequently, the Ti film and the Au film are left only the gate insulation film by lift-off method to form the gate electrode of the Au/Ti structure (FIG. 5A).

Figure 5B:
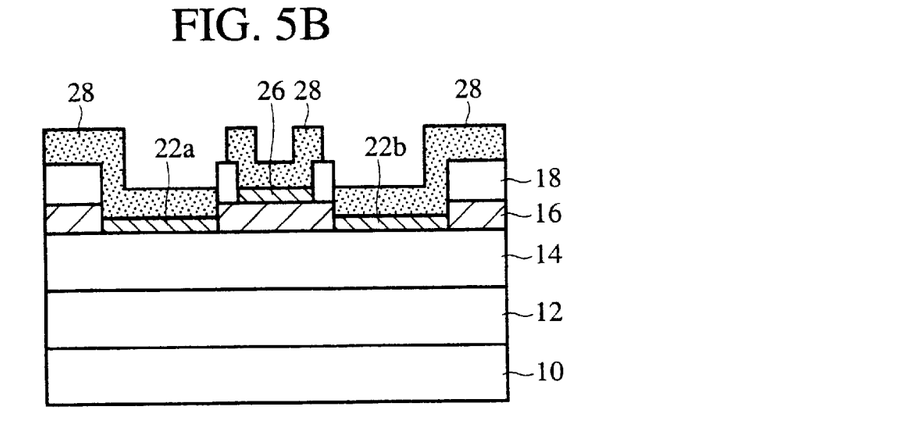

Then, a metallization layer 28 of an Au film is formed in connection with the source/drain electrodes 22a, 22b and the gate electrode 26 (FIG. 5B). The thus-formed metallization layer 28 is isolated from the MISFET by the inter-layer insulation film 18, and the metallization layer 28 can be connected to a plurality of the devices.

Figure 5C:
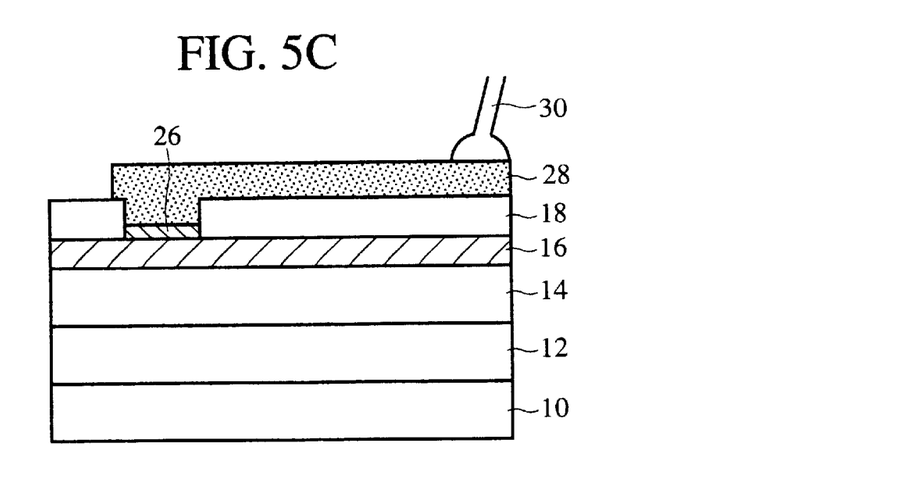

Next, a wire 30 which is to be connected to outside terminals, etc. is bonded to the metallization layer 28 (FIG. 5C). FIG. 5C is a vertical sectional view as viewed in FIG. 5B of the gate electrode 26.

On the inter-layer insulation film 18, in addition to the metallization layer 28 and the wire 30, a device, such as a resistor, an inductor, a capacitor or others may be formed. Thus, these devices can constitute various integrated circuits.

As described above, according to the present invention, the insulation film formed on the GaS film is etched by the etchant containing an aqueous solution of hydrogen fluoride and an aqueous solution of ammonium fluoride, whereby the insulation film can be removed with good selectivity without eroding the base GaS film.

The above-described embodiment has been explained above by means of a method for fabricating a MISFET, but the present invention provides a method for etching $SiO_2$ film, SiON film and SiN film with good selectivity with respect to GaS film. The present invention is applicable to various method for fabricating semiconductor devices. That is, the present invention is applicable to any semiconductor device having a structure including $SiO_2$ film, SiON film or SiN film on GaS film, and a method for fabricating the same, including the step of removing only the film on the GaS film.

In the above-described embodiment, the inter-layer insulation film is exemplified by $SiO_2$ film, SiON film and SiN film, but may be these insulation films doped with impurities. That is, the method for fabricating a semiconductor device according to the present invention is applicable to films having etching characteristics substantially equal to those of these insulation films in connection with mixing liquids of an aqueous solution of hydrogen fluoride and an aqueous solution of ammonium fluoride. The doped insulation films are, e.g., PSG (Phospho-Silicate Glass) film, BPSG (Boro-Phospho Silicate Glass), etc.

In the above-described embodiment, the etchant includes an aqueous solution of hydrogen fluoride and an aqueous solution of ammonium fluoride, but etchants containing hydrogen fluoride and ammonium fluoride as main components can achieve the above-described effect of the present invention. That is, substances and liquid chemicals other than hydrogen fluoride and ammonium fluoride may be added in a range which permits the above-described effect of the present invention to be achieved.

What is claimed is:

1. A method for fabricating a semiconductor device comprising etching a $SiO_2$ film, a SiON film or a SiN film formed on a GaS film selectively with respect to the GaS film by use of an etchant containing hydrogen fluoride and ammonium fluoride.

2. A method for fabricating a semiconductor device according to claim 1, wherein the etchant contains ammonium fluoride by an above 8 mixing ratio in terms of mass versus a 1 mixing ratio of hydrogen fluoride.

3. A method for fabricating a semiconductor device comprising the steps of:

forming a gate insulation film of a GaS film on a compound semiconductor layer;

forming an inter-layer insulation film of a $SiO_2$ film, SiON film or SiN film on the gate insulation film;

etching the inter-layer insulation film selectively with respect to the gate insulation film to expose a prescribed region of the gate insulation film; and forming a gate electrode on the exposed gate insulation film.

4. A method for fabricating a semiconductor device according to claim 3, wherein the inter-layer insulation film is etched by an etchant containing hydrogen fluoride and ammonium fluoride.

5. A method for fabricating a semiconductor device according to claim 4, wherein the etchant contains ammonium fluoride by an above 8 mixing ratio in terms of mass versus a 1 mixing ratio of hydrogen fluoride.

* * * * *